United States Patent
Winiecki et al.

(10) Patent No.: US 9,218,513 B2
(45) Date of Patent: Dec. 22, 2015

(54) CIRCUIT AND METHOD WITH IMPROVED MIXER LINEARITY

(71) Applicant: Sequans Communications, Reading (GB)

(72) Inventors: Thomas Winiecki, Reading (GB); Olujide Adeyemi Adeniran, Reading (GB)

(73) Assignee: Sequans Communications, Reading (GB)

( * ) Notice: Subject to any disclaimer, the term of this patent is extended or adjusted under 35 U.S.C. 154(b) by 0 days.

(21) Appl. No.: 13/724,808

(22) Filed: Dec. 21, 2012

(65) Prior Publication Data

US 2014/0176224 A1 Jun. 26, 2014

(51) Int. Cl.
| | |
|---|---|
| *H03K 17/16* | (2006.01) |
| *H02M 3/07* | (2006.01) |
| *G06G 7/12* | (2006.01) |
| *H03D 7/14* | (2006.01) |
| *H03D 7/16* | (2006.01) |

(52) U.S. Cl.
CPC ............... *G06G 7/12* (2013.01); *H03D 7/1441* (2013.01); *H03D 7/1458* (2013.01); *H03D 7/1466* (2013.01); *H03D 7/165* (2013.01); *H03D 2200/0074* (2013.01); *H03D 2200/0088* (2013.01)

(58) Field of Classification Search
CPC ..... G06G 7/12; H03D 7/1458; H03D 7/1466; H03D 7/1441; H03D 7/165; H03D 2200/0088; H03D 2200/0074
USPC .................................................. 327/390, 589
See application file for complete search history.

(56) References Cited

U.S. PATENT DOCUMENTS

| | | | | |
|---|---|---|---|---|
| 5,172,019 | A  * | 12/1992 | Naylor et al. ................. | 327/390 |
| 6,249,154 | B1 | 6/2001 | Jouffre et al. | |
| 6,518,901 | B2 * | 2/2003 | Pinna et al. ................... | 341/122 |
| 6,603,964 | B1 | 8/2003 | Rowley et al. | |
| 6,731,155 | B2 * | 5/2004 | Hakkarainen et al. ........ | 327/390 |
| 6,956,411 | B1 * | 10/2005 | Holloway ....................... | 327/94 |
| 7,098,826 | B2 * | 8/2006 | Madireddy et al. ........... | 341/141 |
| 7,710,164 | B1 * | 5/2010 | Sharma .......................... | 327/94 |
| 8,222,948 | B2 * | 7/2012 | Birk .............................. | 327/390 |
| 8,294,512 | B2 * | 10/2012 | Lee et al. ...................... | 327/589 |
| 8,502,594 | B2 * | 8/2013 | Steensgaard-Madsen .... | 327/390 |
| 8,525,574 | B1 * | 9/2013 | Duggal ......................... | 327/390 |
| 2004/0070439 | A1 | 4/2004 | Sarraj | |
| 2005/0258874 | A1 | 11/2005 | Kudo | |

FOREIGN PATENT DOCUMENTS

WO WO 2009/059831 A2 5/2009

* cited by examiner

*Primary Examiner* — Kenneth B Wells
(74) *Attorney, Agent, or Firm* — Hamilton, Brook, Smith & Reynolds, P.C.

(57) ABSTRACT

A switching circuit is linearized by using a capacitor to apply a drive voltage to an FET, wherein the drive voltage is independent of the signal switched by the switching circuit.

17 Claims, 5 Drawing Sheets

CIRCUIT AND METHOD WITH IMPROVED MIXER LINEARITY

TECHNICAL FIELD

The present invention is in the general field of electronics and relates to improvements in switching, and in some embodiments to improved mixer devices using switches.

BACKGROUND

In wireless telecommunication systems the transmit signal typically occupies a well-defined part of the frequency spectrum and power emitted outside this frequency range is subject to maximum emission limits imposed by regulatory or other requirements. These requirements ensure communication equipment using different parts of the frequency spectrum do not excessively interfere with one another.

The 3GPP (3rd Generation Partnership Project) specification for E-UTRA (evolved-UMTS Terrestrial Radio Access), better known as LTE (Long Term Evolution), now list 38 different frequency bands for use by the latest generation of cellular communication equipment. Many of these bands are located in close vicinity to each other or to frequency bands of incumbent technologies such as television broadcast.

In a number of cases out-of-band emissions are restricted to very low levels just outside the allocated frequency bands. One example of particular interest relates to emissions from LTE band 13 (transmit band at 777 MHz to 787 MHz) into a US public safety band (between 769 MHz and 775). Another example is emissions from LTE band 1 (transmit band at 1920 MHz to 1980 MHz) into the PHS (Personal Handy-phone System) band which is in use in Japan, China, Taiwan and some other Asian countries, and which uses spectrum up to 1930 MHz.

Stringent emission limits that apply just a few megahertz outside the desired transmit channel impose a number of challenging design constraints on the transmitter architecture. FIG. 1 shows a simplified block diagram of a representative architecture of a state-of-the-art LTE transmitter. The user data is interleaved with control data (omitted in the diagram) and modulated using a technique called SC-FDMA (Single-Carrier FDMA) which yields a stream of time-domain data symbols. Between these symbols a cyclic prefix is inserted to effectively create a guard time between the data symbols. At this point in the signal chain the frequency spectrum associated with the data stream is not very well confined to the desired bandwidth and is shaped by digital filtering to reject unwanted out-of-band emissions. Typically, the data stream is then up-sampled to a rate multiple times the native LTE symbol rate which by the process known as aliasing again produces unwanted out-of-band emissions. These can be removed using the anti-aliasing filter shown in FIG. 1.

The signal can then be converted from the digital into the analog domain using a DAC. The radio topology shown is known as a zero-IF architecture where the complex baseband signal is represented by two real-valued signal paths (I and Q) in the analog domain. This type of architecture is very common in low-cost transceiver designs based on CMOS technology.

Following the DAC the signal is filtered again, mainly to remove DAC quantization noise at the duplex offset for FDD radio bands. Then, the I and Q signal paths are jointly up-converted onto an RF carrier in the IQ modulator block. The resulting RF signal is then amplified and filtered again before being transmitted from the antenna.

The previously-discussed emission limits set design constraints on a number of blocks shown in the architecture in FIG. 1. For example, the combination of pulse shaping, digital anti-aliasing filter and analog reconstructing filter must suppress out-of-band power at the critical frequency offsets adequately so they make negligible contribution to out-of-band noise after up-conversion to RF and RF amplification. Furthermore, all blocks in the analog and RF signal path must be linear enough to avoid spectral re-growth products violating the out-of-band emission limits. This is of particular importance to wide transmit signal allocations where the distance between allocated transmit channel and protected frequency band is less that the bandwidth of the signal and third-order intermodulation products are critical.

For LTE in particular, there is also another important case which drives the linearity constraints of the IQ modulator. Assume a narrow transmit signal (narrow resource block allocation in case of LTE) at some offset corresponding to angular frequency $\Omega_{IF}$ from the carrier with angular frequency $\Omega_{LO}$. For simplicity, we assume the transmit signal at offset $\Omega_{IF}$ is a pure tone represented by the two baseband voltages $$V_I = A \cdot \cos(\Omega_{IF} \cdot t) \text{ and}$$

$$V_Q = A \cdot \sin(\Omega_{IF} \cdot t).$$

The baseband signal path is typically realized using differential circuitry which has almost negligible even-order non-linearity. However, assume a degree of odd-order non-linearity which can be expressed as a polynomial of the form $V_{out} = c_1 \cdot V_{in} + c_3 \cdot V_{in}^3 + c_5 \cdot V_{in}^5 + \ldots$.

Using the complex tone as an input signal Vin yields the following output signals:

$$V_{out,I} = A \cdot (c_1 + \tfrac{3}{4}c_3 + \tfrac{5}{8}c_5 + \ldots) \cdot \cos(\Omega_{IF} \cdot t) + A^3 \cdot (+\tfrac{1}{4}c_3 + \tfrac{5}{16}c_5 + \ldots) \cdot \cos(3\Omega_{IF} \cdot t) + A^5 \cdot (+\tfrac{1}{16}c_5 + \ldots) \cdot \cos(5 \cdot \Omega_{IF} \cdot t) + \quad (1)$$

$$V_{out,Q} = A \cdot (c_1 + \tfrac{3}{4}c_3 + \tfrac{5}{8}c_5 + \ldots) \cdot \sin(\Omega_{IF} \cdot t) + A^3 \cdot (-\tfrac{1}{4}c_3 - \tfrac{5}{16}c_5 + \ldots) \cdot \sin(3\Omega_{IF} \cdot t) + A^5 \cdot (+\tfrac{1}{16}c_5 + \ldots) \cdot \sin(5 \cdot \Omega_{IF} \cdot t) + \quad (2)$$

When (1) and (2) are up-converted to RF in a quadrature mixer and summed, the resulting spectrum contains frequency products at odd harmonics of the input tone. The tones appear only on one side of the carrier due to the image cancellation occurring in the summation stage of the IQ modulator.

The resulting spectrum is shown in FIG. 2, which shows the spectrum at RF output. Odd-order non-linearity in the IQ modulator creates unwanted out-of-band products at frequency offsets corresponding to odd multiples of the input signal frequency offset from carrier.

The rejection of the third-order product at $\Omega_{LO} - 3 \cdot \Omega_{IF}$, which we shall refer to as LOIM3, is given by the ratio $16 c_1^2/c_3^2$. Third-order nonlinearity is often determined and chararacterized by passing two tones of equal amplitude through a nonlinear system and measuring the rejection between unwanted intermodulation product and wanted tones. By comparison, that rejection, normally referred to as IM$_3$, is given by IM$_3 = 16/9 \cdot c_1^2/c_3^2$.

For LTE band 13 support of a narrow RB allocation at full power requires a rejection of the unwanted tone by at least 66 dB with respect to the wanted tone to meet emission specs for the public safety band. It turns out that this requirement is much more stringent than the general linearity requirement derived from mask, ACLR (adjacent channel leakage ratio) or EVM (error vector magnitude) specifications.

For baseband gain and filter stages the required linearity can be achieved relatively easily but for IQ modulator the target figure represents a serious design challenge.

The 3GPP specification for the critical LTE bands allows reduction of transmitter output power for the most challenging out-of-band emission scenarios. This automatically reduces the effect of non-linearity but also reduces the transmit range of the device. It is therefore highly desirable to meet the out-of-band emission specifications even at maximum allowed output power by dedicated design.

Conceptually the most straight-forward way of reducing out-of-band emissions is to employ filtering of the signal in the RF front-end after the power amplifier just before the signal is coupled into the antenna. Recent advancements of SAW and FBAR technology have made it possible to achieve significant rejection of unwanted out-of-band power just a few megahertz away from the band edge. However, even the most sophisticated filters are not able to fully reject the discussed narrow-band signals in case of LTE bands 13 and band 1. Often, a second RF filter is added before the signal is amplified in the power amplifier to clear up unwanted frequency products in the transmit chain which increases the cost and footprint of the overall solution.

To improve the linearity of the mixer, a well-known technique is to use active current-driven mixer topologies (known as Gilbert mixers) where the input current is linearized through a feedback-loop in the transconductor stage. In that topology, negative feedback is created using an operational amplifier, the penalty being that the modulator is now noisy and will not meet the Rx-band noise requirements for LTE FDD bands.

Finally, it is possible to correct for non-linearity occurring in the analog signal path by applying pre-distortion in the digital domain. This technique requires characterization or possibly product-level calibration to find the correct parameters necessary to cancel the unwanted frequency products. It also adds significantly to overall complexity of the solution as the pre-distortion, digital filtering, analog filtering and analog non-linearity all interact in a non-trivial way.

FIG. 3 shows a simplified block diagram of a passive Transmit (Tx) IQ Modulator, essentially a voltage-mode passive mixer used with 25% duty-cycle local oscillator (LO) I and Q waveforms used, to realize the I+jQ summation in voltage mode at RF. Analytical analysis shows that the conversion loss is at best $2\sqrt{2}/\pi$ or −0.9 dB.

We have selected a passive mixer as this general type of mixer exhibits extremely low noise. The dominant noise source is thermal noise of switch on-resistance, which can be as low as 0.575 nV/√Hz for 20Ω switch on-resistance. Such mixers are also as linear as the switches used within them, with nMOS and CMOS (transmission gate) switches commonly used. It should be noted that in the context of a switch, non-linearity is expressed as the deviation from constant resistance with the magnitude of signal passing through the switch in its on state. Thus a truly linear switch has constant on-resistance regardless of the magnitude of a signal carried.

The time-varying I and Q input signals $V_{in,\,IP}$, $V_{in,\,IN}$, $V_{in,\,QP}$ and $V_{in,\,QN}$ are periodically sampled by the clock signals $\phi_1$, $\phi_Q$, $\phi_I'$ and $\phi_Q'$. The clock signals are periodic with an angular frequency $\Omega_{LO}$.

In a specific embodiment, the clock signals are arranged such that they have roughly 25% duty cycle which means only one pair of switches is on at any moment in time and the other three pairs of switches are off. The use of 25% duty cycle has a number of advantages such as improved conversion gain and reduced mixer noise figure. The clock signals are illustrated in FIG. 4.

As explained above, any switch non-linearity will get modulated onto the sampled input waveform thereby creating undesirable IF harmonics which are then up-converted to RF. The most problematic harmonic is the third harmonic, which appears at RF with an angular frequency $\Omega_{LO}-3\cdot\Omega_{IF}$. Higher order products also exist but they are generally less problematic than the aforementioned third-order product.

Consider just one of the eight switches in FIG. 3. Typically, this switch function is realized using a pMOS or nMOS device or a CMOS switch as mentioned above, with the latter preferred as a result of its higher dynamic range and the fact that charge injection can be reduced by dimensioning the complementary devices equally (this is further expatiated below). Equation 3 gives the CMOS switch on-resistance $R_{switch}$ to the first-order.

$$R_{switch} \cong \frac{1}{K_n \frac{W}{L}(V_{gsn} - V_{Tn}) + K_p \frac{W}{L}(V_{sgp} - |V_{Tp}|)} \quad (3)$$

Here, $K_n$ and $K_p$ are process-dependent constants relating to the transconductances of the transistors, W and L are the width and length of the transistors, respectively, $V_{gsn}$ is the gate-source voltage of the nMOS, $V_{sgp}$ is the source-gate voltage of the pMOS and $V_{Tn}$ and $V_{Tp}$ are the threshold voltages of the two devices, respectively. In this case the values of $V_{gsn}$ and $V_{sgp}$ both depend on the input voltage level, $V_{in}$.

Hence, even in the first order approximation (3), the on-resistance of the transmission gate is a function of the input voltage when in an on-state; this is the root-cause for mixer nonlinearity. The gate-to-channel capacitances are also non-linear and input-dependent, contributing even further to the sampling distortion but can be minimized or even eliminated by connecting the devices' bulk terminal to the source terminal (possible for the nMOS device if a twin-tub process technology is available) and by using non-overlapping clocks which also minimizes the effect of the gate-to-source/drain parasitic capacitances.

FIG. 5 depicts the non-linear sampling switch in sampling mode. It is shown to have a main current path with a variable series resistance ($R_{S1}$) variable with gate source voltage ($V_{gs}$), a gate-source capacitance ($C_{gs}$) a gate-drain capacitance ($C_{gd}$) and a capacitor (C1) in series with the main current path representing RF amplifier gate capacitance.

The s-domain transfer function from the sampled input to the bottom plate of C1 under sampling conditions with the parasitic capacitances neglected is given by equation 4:

$$\frac{V_{C1}}{V_{in}}(s) = \frac{1}{1 + sC_1 R_{S1}} \quad (4)$$

Substituting (3) in (4) and recognizing that $V_{gs}$ for switch S1 is given by $V_{gs}=V_g-V_{in}$, equation (5) results in the following expression:

$$\frac{V_{C1}}{V_{in}}(s) = \frac{K_n \frac{W}{L}(V_{gn} - V_{Tn} - V_{in}) + K_p \frac{W}{L}(V_{in} - V_{gp} - |V_{Tp}|)}{K_n \frac{W}{L}(V_{gn} - V_{Tn} - V_{in}) + K_p \frac{W}{L}(V_{in} - V_{gp} - |V_{Tp}|) + sC_1} \quad (5)$$

Rearranging (5) gives a non-linear expression of $V_{in}$ as equation 6:

$$V_{C1}(s) = \frac{K_n \frac{W}{L}(V_{gn} - V_{Tn} - V_{in}) + K_p \frac{W}{L}(V_{in} - V_{gp} - |V_{Tp}|)}{K_n \frac{W}{L}(V_{gn} - V_{Tn} - V_{in}) + K_p \frac{W}{L}(V_{in} - V_{gp} - |V_{Tp}|) + sC_1} \cdot V_{in} \quad (6)$$

A problem then focuses on how to provide a highly linear switch usable in a mixer, and capable of being used in such a mixer for an LTE device. Such a switch would of course be usable in other applications to good effect, and would not be limited to mixer application.

Various methods have been employed in the past to address this issue. The simplest is an arbitrary increase of the aspect ratio of the device until the on-resistance error term with varying input is small enough to be negligible. This is unsuitable for high-speed designs.

Employing low threshold voltage devices in 1.2V 65 nm process-node is also not sufficient to address this issue.

SUMMARY

In a first aspect there is provided a mixer having input nodes for receiving signals to be mixed, and comprising at least one gate arranged to selectively couple an input node to an output node, the gate being arranged to be driven by a sampling clock signal, the gate comprising at least one FET having a respective control node, the mixer having circuitry for applying a voltage between the gate and source nodes of the at least one FET in the on-state, which voltage is independent of input signals at the input nodes.

The mixer may be a quadrature mixer.

The gate may comprise a pair of complementary FETS connected to form a transmission gate.

The circuitry may comprise a capacitor connected in a bootstrap configuration. In a mixer having first and second supply rails providing, in use, first and second supply rail voltages, the circuitry may be configured to apply a voltage substantially equal to the sum of the voltage at the input node and the mean of the supply rail voltages to the control node of the FET.

In a second aspect there is provided a switching circuit comprising a transmission gate, the transmission gate comprising an nMOS transistor and a pMOS transistor, each of the transistors having a respective control node, the switching circuit further comprising respective capacitors connected in bootstrap configuration to each control node whereby the on-resistance of the transmission gate is substantially constant and independent of signals gated by the transmission gate.

In a third aspect there is provided a sample-and-hold circuit comprising a switching circuit of the second aspect.

In a fourth aspect there is provided an analog-to-digital converter comprising a sample-and-hold circuit of the third aspect.

In a fifth aspect there is provided a method of operating a gating circuit using an input signal, the gating having first and second supply rails providing first and second supply voltages, the method comprising adding, to the input signal voltage, a voltage substantially equal to the mean of the supply rail voltages.

In a further aspect there is provided a mixer having input nodes for receiving signals to be mixed, and comprising at least two gates, each arranged to selectively couple a respective input node to an output node, the gates being arranged to be driven by respective sampling clock signals, each gate comprising at least one FET having a respective control node, the mixer having circuitry for applying a voltage between the gate and source nodes of the at least one FET in the on state, which is independent of voltages at the input nodes.

In a still further aspect there is provided a mixer having an input node for receiving a voltage, and plural output nodes, the mixer comprising at least two gates, each arranged to selectively couple a respective input node to a respective output node, the gates being arranged to be driven by respective sampling clock signals, each gate comprising at least one FET having a respective control node, the mixer having circuitry for applying a voltage between the gate and source nodes of the at least one FET in the on state, which is independent of voltages at the input node.

The sampling clock signals may be non-overlapping.

The mixer may in some embodiments be a quadrature mixer.

In some embodiments, the gate comprises a pair of complementary FETS connected to form a transmission gate.

In some embodiments, the circuitry comprises a capacitor connected in a bootstrap configuration.

DETAILED DESCRIPTION

In an embodiment a virtual drive voltage, $V_{drive}$, is created, added to a replica of $V_{in}$ and then the resultant voltage $V_g$ applied to the gates of the switch devices, i.e.

$$V_g = V_{drive} + V_{in} \quad (7)$$

Then equation (6) becomes $$V_{C1}(s) = \frac{K_n \frac{W}{L}(V_{drive} - V_{Tn}) + K_p \frac{W}{L}(-V_{drive} - |V_{Tp}|)}{K_n \frac{W}{L}(V_{drive} - V_{Tn}) + K_p \frac{W}{L}(-V_{drive} - |V_{Tp}|) + sC_1} \cdot V_{in} \quad (8)$$

This becomes a linear expression in $V_{in}$. The input signal is superimposed on the control voltages of the switch gate to hold the gate-to-source voltage constant and thus achieve constant on-resistance to a first-order approximation over the entire input range.

One method of creating such a virtual drive voltage is to use a capacitor which is pre-charged while the switch is off and then provides a raised gate voltage in the on-state by a bootstrapping scheme.

Figure 6:
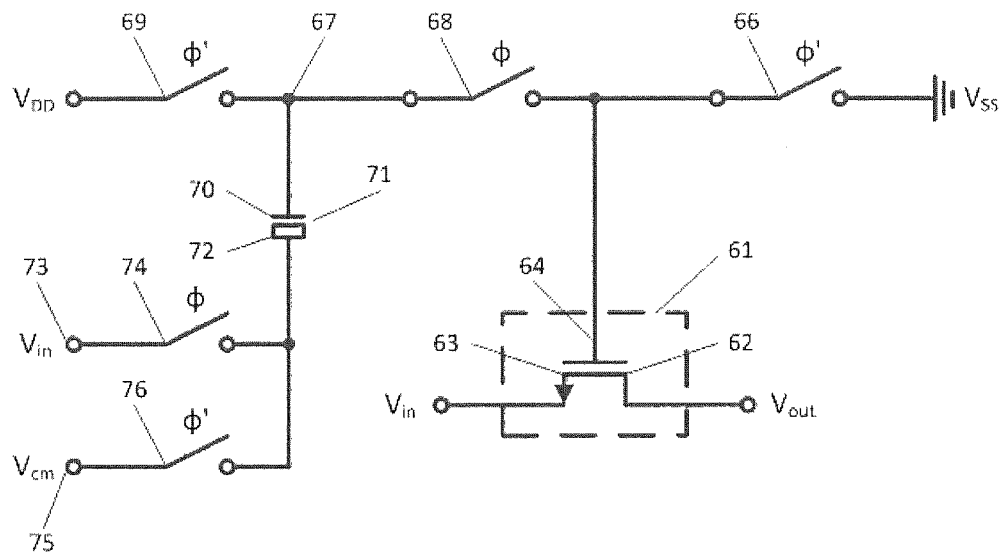
FIG. 6 shows a bootstrap circuit using an nMOS sampling switch.

Referring to FIG. 6, the circuit has an nMOS switch (61) with its current path between drain (62) and source (63) controlled by the voltage at its gate (64). The gate is connectable to a reference voltage ($V_{SS}$) via a first switch (66) and to a circuit node (67) via a second switch (68). The circuit node (67) is connected to a positive supply rail $V_{DD}$ via a third switch (69), and to a first, upper as shown, plate (70) of a capacitor (71) having a second plate (72). The second, lower as shown, plate (72) of the capacitor (71) is connected to an input control node (73) via a fourth switch (74) and to a common mode node (75) via a fifth switch (76).

The first, third and fifth switches (66, 69, 76) are controlled by a first clock signal φ' and the second and fourth switches (68, 74) by a second non-overlapping clock signal φ.

The common mode node (75) $V_{cm}$, is set, in this embodiment, to a constant reference approximately half way between the reference voltage $V_{SS}$ and the positive supply $V_{DD}$ and corresponds approximately to the average level of $V_{in}$. In other embodiments it is derived directly from the supply rails—for example via a divider circuit. In both cases it will be set to be a value between 40% and 60% of the difference between the reference voltage $V_{WW}$ and the positive supply $V_{DD}$.

When clock φ is low, the first, third and fifth switches (66, 69, 76) are closed. Second and fourth switches (68, 74) are off, and thus substantially open-circuit. The common mode voltage, $V_{cm}$ is thus applied to the lower plate (72) of capacitor (71). The supply voltage, $V_{DD}$ is applied to the first upper plate of the capacitor (71) and the capacitor charges to $V_{DD}-V_{cm}$ while the gate of the nMOS switch (61) is held low by first switch (66) connecting it to the reference voltage, thereby keeping the nMOS switch off. When φ goes high, the first, third and fifth switches (66, 69, 76) are opened and second and fourth switches (68, 74) closed. This applies $V_{in}$ to the lower, as shown, plate of capacitor (71), which means the top plate rises to $V_{in}+(V_{DD}-V_{cm})$. This is applied via second switch (68) to the gate of the nMOS switch.

The voltage $V_{gn}$ applied to the gate of the nMOS switch is, as has been explained, shown in equation (9)

$$V_{gn}=V_{DD}-V_{cm}+V_{in} \quad (9)$$

The gate-source voltage $V_{gsn}$ of the nMOS switch (61) is $V_{gn}-V_{in}$.

Simplifying: $V_{gsn}=(V_{DD}-V_{cm}+V_{in})-V_{in}=V_{DD}-V_{cm}$ (10)

for most input voltages, within the limits of reasonable and finite on-resistance of the second and fourth switches (68,74), and the switch is guaranteed linear, in other words has a constant on-resistance, since its gate-source voltage is independent of $V_{in}$. Typically, first, fourth and fifth switches (66, 74,76) are nMOS devices and second and third switches (68,69) pMOS devices. All of the first-fifth switches are sized an order of magnitude smaller than the dimensions of the nMOS switch to minimize the depletion of the charge of capacitor (71) via parasitics of the first-fifth switches. The dominant parasitic is then that of the nMOS switch (61), and the dimensions of the capacitor (71) are at least an order of magnitude higher than its parasitic capacitance.

Figure 7:
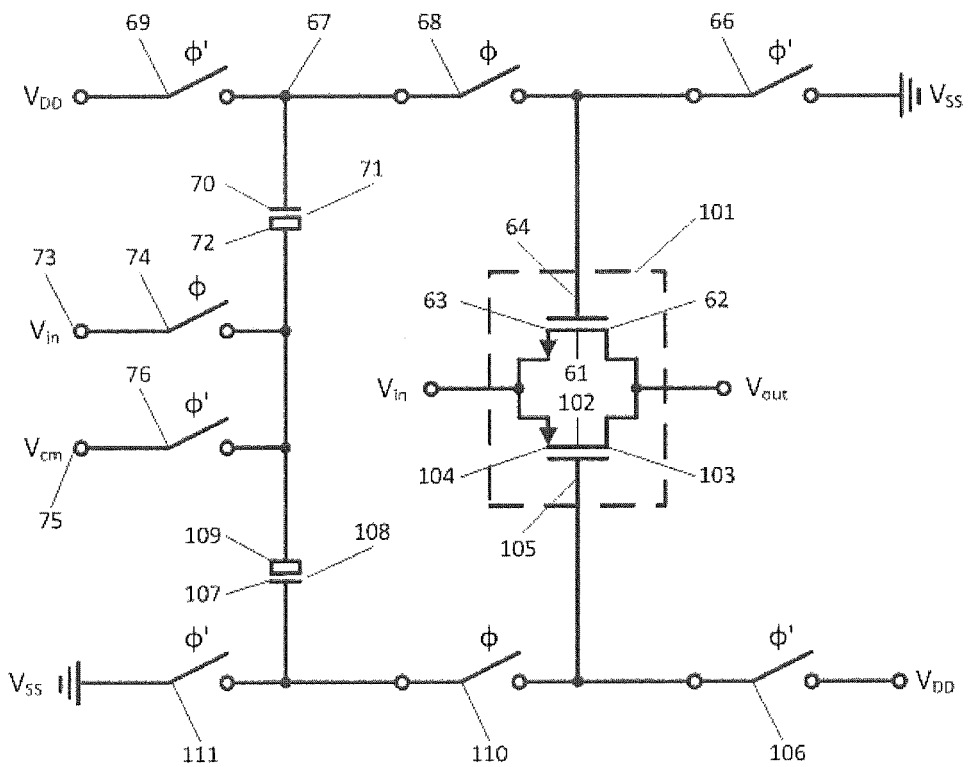
FIG. 7 shows a simplified CMOS sampling switch lineariser circuit.

In order to further enhance the switch linearity and increase available dynamic range, in another embodiment the nMOS device is replaced by a transmission gate as shown in FIG. 7, and then used in the linearization of a Tx IQ Modulator.

In an embodiment of such a modulator non-overlapping clocks are used and the pMOS and nMOS devices are sized identically within the CMOS switch to address the mixer issue of signal-dependent charge injection (to a first order) from switch channel capacitance, gate-to-drain overlap capacitance and junction capacitance point of view. Note that these features are specific to mixers and will not all be essential in all switch applications.

Note that for the embodiment shown it is necessary that φ and φ' are non-overlapping. In one embodiment, we use a 25% duty cycle clock which provides added advantages in terms of mixer noise figure and conversion gain.

Secondly, the use of fully-differential paths also minimizes even-order nonlinearities as a result of the above. CMOS switch linearization in addition alleviates the effect of signal-dependent switch on-resistance on IF sampling non-linearity and yields better distortion performance over a bootstrapped nMOS switch for IF-to-RF up-conversion applications.

Figure 1:
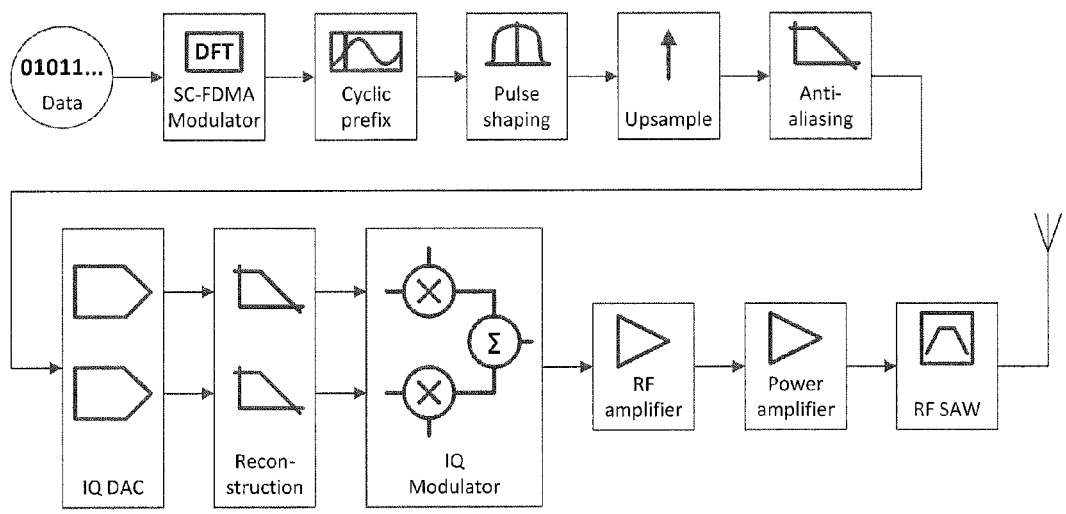
FIG. 1 is a simplified block diagram of one example of an LTE transmitter.
Figure 2:
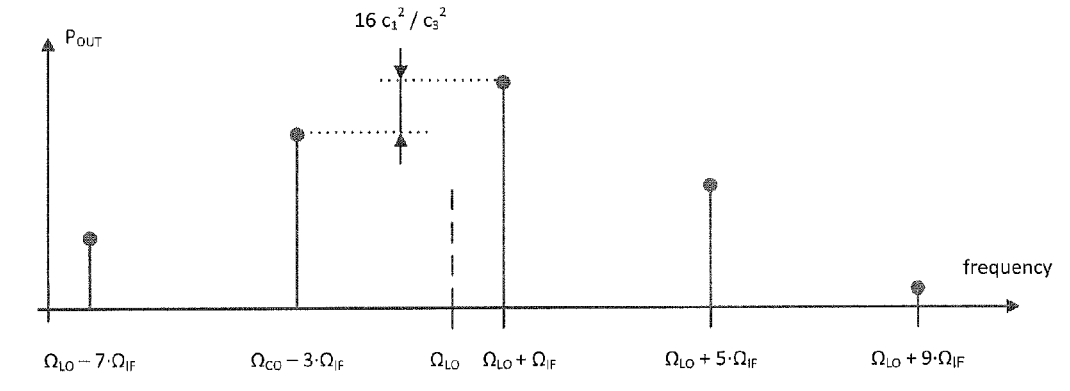
FIG. 2 shows a spectrum at RF output of the transmitter of FIG. 1 when transmitting a narrow band signal and in the presence of non-linearity.
Figure 3:
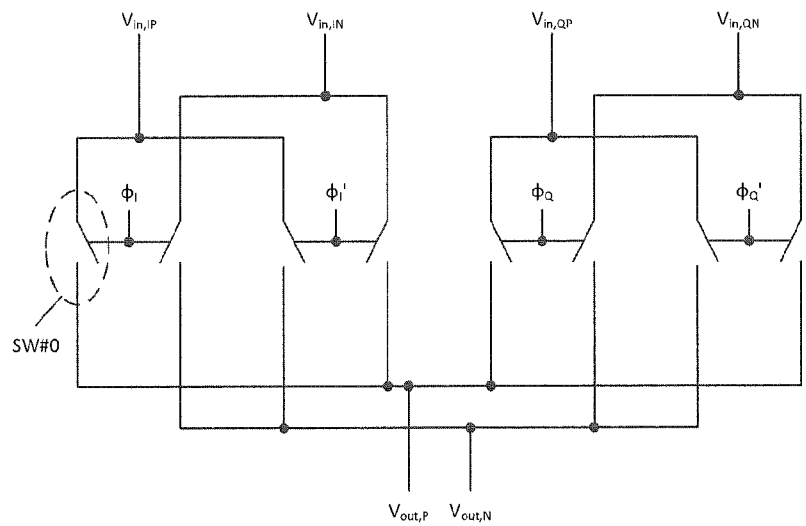
FIG. 3 shows a simplified block diagram of a passive Transmit (Tx) IQ Modulator.
Figure 4:
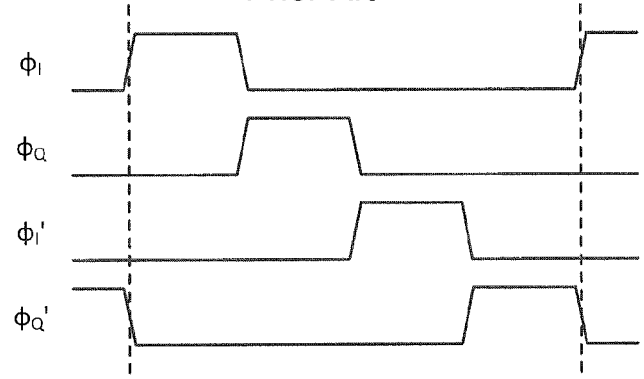
FIG. 4 shows clock signals used in the modulator of FIG. 3.
Figure 5:
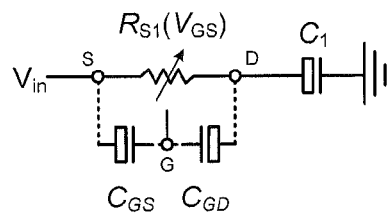
FIG. 5 shows an equivalent diagram of a non-linear sampling switch.

Note that the circuit shown in FIG. 7 represents one of the eight switches shown in the diagram in FIG. 3. Although the circuit is similar to that of FIG. 6, it will be described in full for clarity.

The circuit has CMOS transmission gate (101) comprising an nMOS switch (61) and a pMOS switch (102) having their current paths connected in full parallel.

The nMOS switch (61) has its current path between drain (62) and source (63) controlled by the voltage at its gate (64). The gate is connectable to a reference voltage ($V_{SS}$) via a first switch (66) and to a circuit node (67) via a second switch (68). The circuit node (67) is connected to a positive supply rail $V_{DD}$ via a third switch (69), and to a first, upper as shown, plate (70) of a first capacitor (71) having a second plate (72). The second, lower as shown, plate (72) of the first capacitor (71) is connected to an input control node (73) via a fourth switch (74) and to a common mode node (75) via a fifth switch (76).

The pMOS switch (102) likewise has its current path between its drain (103) and source (104) controlled by the voltage at its gate (105). The gate (105) is connectable to the positive supply rail $V_{DD}$ via a sixth switch (106), and to a first lower, as shown, plate (107) of a second capacitor (108) having a second plate (109) via a seventh switch (110). The second, upper as shown, plate (109) of the second capacitor is connected to the second plate (72) of the first capacitor (71). The first plate (107) of the second capacitor (108) is connectable to the reference voltage ($V_{SS}$) via an eighth switch (111) The first, third, fifth, sixth and eighth switches (66, 69, 76, 106, 111) are controlled by a first clock signal φ' and the second, fourth and seventh switches (68,74, 110) by a second clock signal φ where φ' and φ are non-overlapping.

The common mode node (75) is at $V_{cm}$, defined as the time-average of the input voltage Vin and fixed at roughly the mean voltage of the positive supply rail $V_{DD}$ and the reference voltage $V_{SS}$.

When clock φ is low, the first, third, fifth, sixth and eighth switches (66, 69, 76, 106, 111) are closed. Second, fourth and seventh switches (68, 74, 110) are off, and thus substantially open-circuit. The common mode voltage, $V_{cm}$ is thus applied to the lower plate (72) of capacitor (71). The supply voltage, $V_{DD}$ is applied to the first upper plate of the capacitor (71) and the capacitor charges to $V_{DD}-V_{cm}$ while the gate of the nMOS switch (61) is held low by first switch (66) connecting it to the reference voltage, thereby keeping the nMOS switch off.

When goes high, the first, third and fifth switches (66, 69, 76) are opened and second and fourth switches (68, 74) closed.

As discussed above this results in the nMOS switch having a gate-source voltage of $V_{DD}-V_{cm}$.

Further, when clock $\phi$ is low the common mode voltage $V_{cm}$ is applied via fifth switch (76) to the upper plate (109) of the second capacitor (108). Eighth switch (111) applies the reference voltage $V_{SS}$ to the lower plate (107) of the second capacitor (108). Hence the second capacitor (108) is charged so that its upper plate is at $V_{cm}-V_{SS}$ above the lower plate (107).

Then clock $\phi$ goes high, opening sixth and eight switches, and closing fourth switch (74) thereby applying $V_{in}$ to the top plate (109). Hence, the lower plate (107) of the second capacitor (108) is now at $V_{in}-(V_{cm}-V_{SS})=V_{in}-V_{cm}+V_{SS}$ This is applied to the gate of the pMOS switch (102). Hence the gate-source voltage of the pMOS switch (102) is $V_{cm}-V_{SS}$.

It will be seen that this voltage is also independent of $V_{in}$, within the limits of reasonable and finite on-resistance of fourth and seventh switches (74, 110). Hence the pMOS switch (102) is also guaranteed linear. In this way, the combination of the pMOS and nMOS switches enhances overall switch on-resistance linearity and dynamic range.

Figure 8:
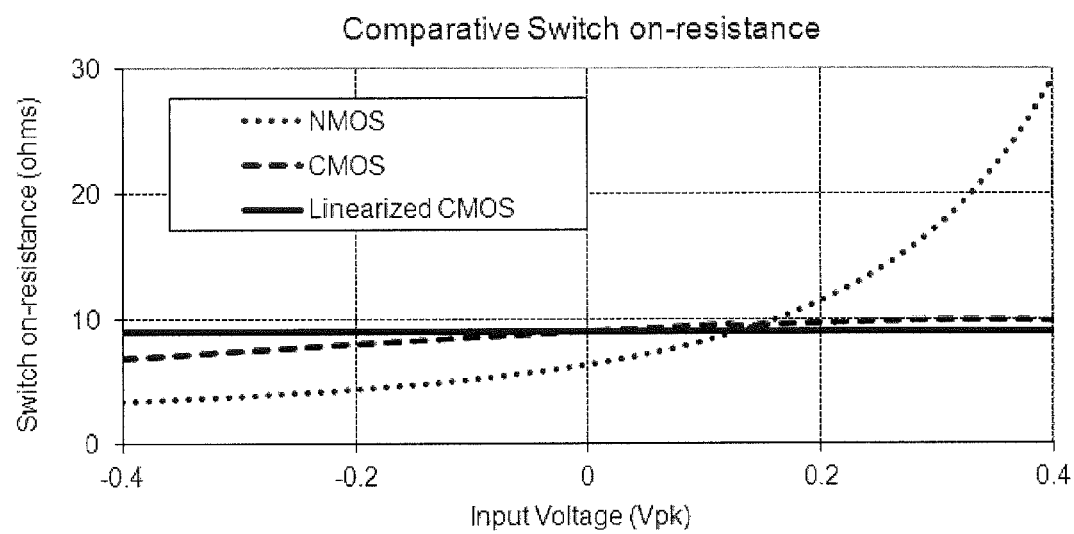
FIG. 8 is a plot of conventional nMOS, conventional CMOS and linearised CMOS switch resistance against input voltage.

FIG. 8 is a plot of conventional nMOS, conventional CMOS and linearised CMOS switch resistance against input voltage. The plots below were created whilst the CMOS switches were in their on-state. The pMOS device bulks were connected to the source to eliminate bulk modulation dependence. The nMOS device bulks were connected to $V_{SS}$ to emulate a single-tub n-well CMOS process technology and make the circuit more generic.

Figure 9:
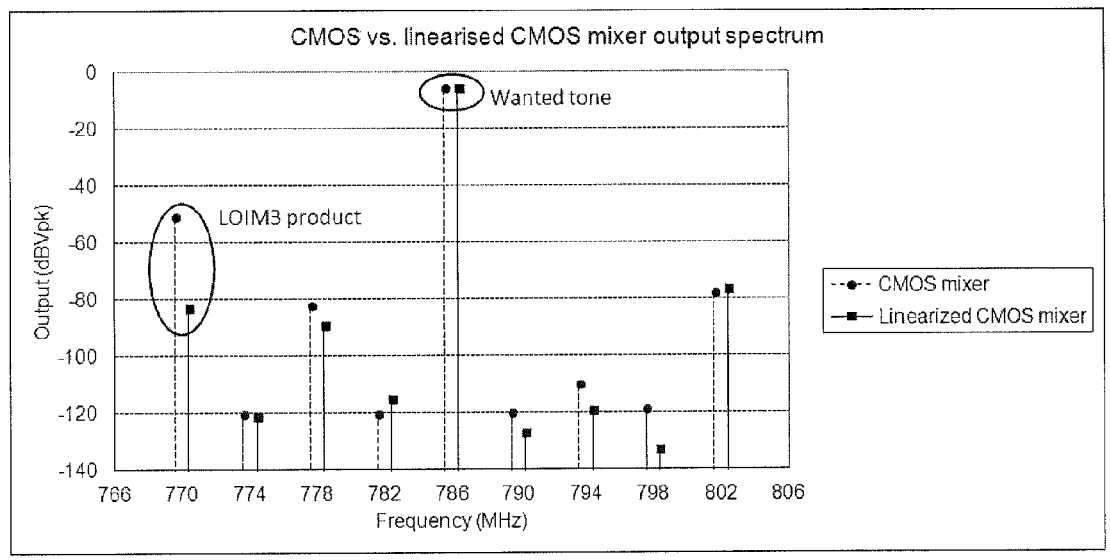
FIG. 9 shows comparative output spectrum for conventional CMOS switch vs. linearised CMOS switch Tx IQ Modulator.

FIG. 9 shows comparative output spectrum for conventional CMOS switch vs. linearised CMOS switch Tx IQ Modulator. The spectrum shows a wanted tone at 786 MHz, 4 MHz above the carrier at 782 MHz. The third-order LOIM3 product is located at 770 MHz. As can be seen the linearization reduces the power in this unwanted tone by more than 30 dB.

Figure 10:
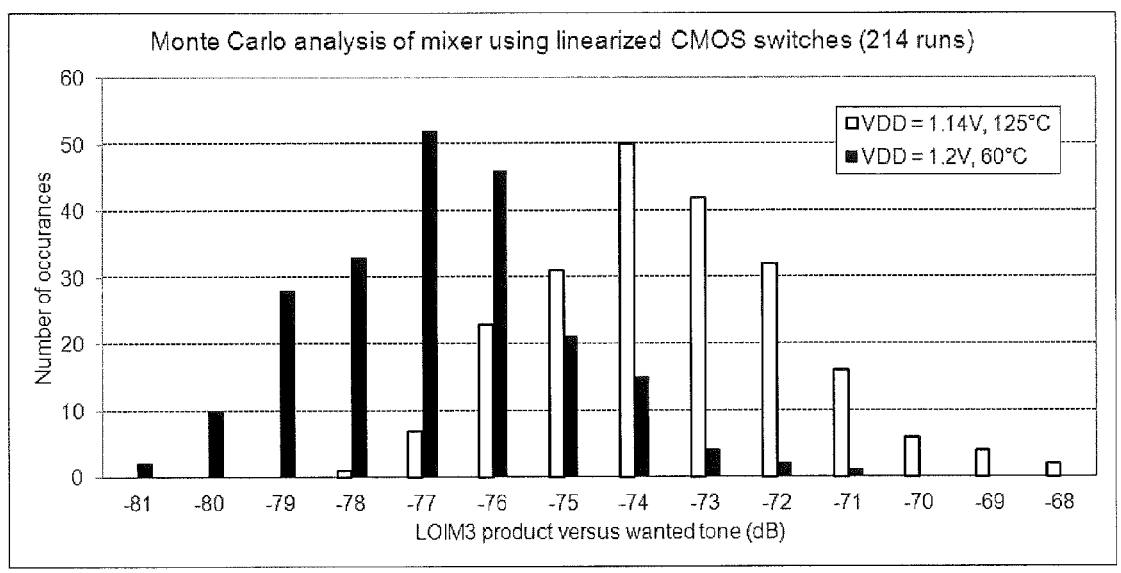
FIG. 10 shows linearised Tx IQ Modulator LOIM3-to-Wanted performance with Monte-Carlo process variation at 1.2V and 60° C. and 1.14V and 105° C.

Finally, FIG. 10 gives linearised Tx IQ Modulator LOIM3-to-Wanted performance with Monte-Carlo process variation at 1.2V and 60 deg C. and 1.14V and 105 deg C. showing that target −66 dBc specification is achieved, erstwhile impossible with conventional CMOS-based Tx IQ Modulator.

Although described in the context of a FET implementation, the invention is equally applicable to bipolar circuits.

Used in a mixer, the switch allows embodiments to achieve extremely high linearity at the same time as high conversion gain and low noise figure. The power consumption is comparable to a standard implementation. The design guarantees performance over process corners, temperature and supply voltage which means no calibration is necessary at production. As a result, out-of-band emissions can be kept low using off-the-shelf components for external filtering and no back-off of transmit power is needed to meet the emission criteria.

Embodiments of a mixer as described can meet LTE linearity requirements and at the same time adds little noise to the system. It may be designed to have low power consumption and to not require calibration.

The invention is not restricted to the features described but extends to the full scope of the claims.

What is claimed is:

1. A mixer having input nodes for receiving signals to be mixed, and comprising at least one gate arranged to selectively couple an input node of the mixer to an output node, the gate being arranged to be driven by a sampling clock signal, the gate comprising at least one FET having a gate node and a source node, the mixer having circuitry for applying a voltage between the gate and source nodes of the at least one FET in the on state, which voltage is independent of signals at the mixer input nodes, the mixer further having first and second supply rails comprising a positive rail and a reference rail, and providing, in use, first and second supply rail voltages, wherein the circuitry is configured to apply a voltage substantially equal to the sum of the voltage at the input node and the positive supply rail minus a common mode voltage to the gate node of the at least one FET.

2. The mixer of claim 1, wherein the mixer is a quadrature mixer.

3. The mixer of claim 1, wherein the gate comprises a pair of complementary FETS connected to form a transmission gate.

4. The mixer of claim 1, wherein the circuitry comprises a capacitor connected in a bootstrap configuration.

5. The mixer of claim 4, wherein the capacitor is pre-charged while the gate is off and provides a raised gate voltage in the on state.

6. A mixer having input nodes for receiving signals to be mixed, and comprising at least two gates, each gate arranged to selectively couple a respective mixer input node to an output node, the gates being arranged to be driven by respective sampling clock signals, each gate comprising at least one FET having a respective control node and a source node, the mixer having circuitry for applying a voltage between the control and source nodes of the at least one FET in the on state, which voltage is independent of signals at the mixer input nodes, the mixer further having first and second supply rails comprising a positive rail and a reference rail, and providing, in use, first and second supply rail voltages, wherein the circuitry is configured to apply a voltage substantially equal to the sum of the voltage at the input node and the positive supply rail minus a common mode voltage to the control node of the at least one FET.

7. The mixer of claim 6, wherein the sampling clock signals are non-overlapping.

8. The mixer of claim 6, wherein the mixer is a quadrature mixer.

9. The mixer of claim 6, wherein the gate comprises a pair of complementary FETS connected to form a transmission gate.

10. The mixer of claim 6, wherein the circuitry comprises a capacitor connected in a bootstrap configuration.

11. A mixer having an input node for receiving a signal, and plural output nodes, the mixer comprising at least two gates, each gate arranged to selectively couple a respective mixer input node to a respective output node, the gates being arranged to be driven by respective sampling clock signals, each gate comprising at least one FET having a respective control node and a source node, the mixer having circuitry for applying a voltage between the control and source nodes of the at least one FET in the on state, which voltage is independent of the signal at the mixer input node, the mixer further having first and second supply rails comprising a positive rail and a reference rail, and providing, in use, first and second supply rail voltages, wherein the circuitry is configured to apply a voltage substantially equal to the sum of the voltage at the input node and the positive supply rail minus a common mode voltage to the control node of the at least one FET.

12. The mixer of claim 11, wherein the sampling clock signals are non-overlapping.

13. The mixer of claim 11, wherein the mixer is a quadrature mixer.

14. The mixer of claim 11, wherein the gate comprises a pair of complementary FETS connected to form a transmission gate.

15. The mixer of claim 11, wherein the circuitry comprises a capacitor connected in a bootstrap configuration.

16. A method of operating a mixer circuit having input nodes for receiving signals to be mixed, the mixer circuit comprising at least one gate arranged to selectively couple an input node of the mixer to an output node, the gate being arranged to be driven by a sampling clock signal, the gate comprising at least one transistor having a control node and a reference node, the mixer circuit having first and second supply rails comprising a positive rail and a reference rail and providing first and second supply voltages, the method comprising:

applying a voltage between the control and reference nodes of the at least one transistor in the on state, which voltage is independent of signals at the mixer input nodes;

applying a voltage substantially equal to the sum of the voltage at the input node and the positive supply rail minus a common mode voltage to the control node of the at least one transistor.

17. A mixer having input nodes for receiving signals to be mixed, and comprising at least one gate arranged to selectively couple an input node of the mixer to an output node, the gate being arranged to be driven by a sampling clock signal, the gate comprising at least one transistor having a respective control node and a reference node, the mixer having circuitry for applying a voltage between the control and reference nodes of the at least one transistor in the on state, which voltage is independent of signals at the mixer input nodes, the mixer further having first and second supply rails comprising a positive rail and a reference rail, and providing, in use, first and second supply rail voltages, wherein the circuitry is configured to apply a voltage substantially equal to the sum of the voltage at the input node and the positive supply rail minus a common mode voltage to the control node of the at least one transistor.

\* \* \* \* \*